(12) United States Patent
Buchhold

(10) Patent No.: US 6,853,179 B2
(45) Date of Patent: Feb. 8, 2005

(54) ANGLE SENSOR FOR MEASURING MAGNETIC FIELD STRENGTH

(75) Inventor: Reinhard Buchhold, Hamburg (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 88 days.

(21) Appl. No.: 10/221,818

(22) PCT Filed: Jan. 29, 2002

(86) PCT No.: PCT/IB02/00285

§ 371 (c)(1),
(2), (4) Date: Sep. 16, 2002

(87) PCT Pub. No.: WO02/061440

PCT Pub. Date: Aug. 8, 2002

(65) Prior Publication Data

US 2003/0030432 A1 Feb. 13, 2003

(51) Int. Cl.$^7$ .................. G01R 19/00; G01R 19/08; G01R 15/20; G01R 33/09
(52) U.S. Cl. .................... 324/117 R; 324/252
(58) Field of Search ....................... 338/32 R

(56) References Cited

U.S. PATENT DOCUMENTS

| | | | | | |
|---|---|---|---|---|---|
| 4,079,360 A | * | 3/1978 | Ookubo et al. | ....... | 338/32 R X |
| 4,841,235 A | * | 6/1989 | Hastings et al. | ........ | 324/117 R |
| 5,148,106 A | * | 9/1992 | Ozawa | ................... | 324/207.21 |
| 5,966,008 A | * | 10/1999 | Maier et al. | ......... | 324/117 R X |
| 6,356,074 B1 | * | 3/2002 | Ohkawa et al. | ........ | 324/207.21 |

FOREIGN PATENT DOCUMENTS

| | | | | |
|---|---|---|---|---|
| DE | 19755673 A | 7/1999 | ........... | G01R/33/09 |
| DE | 19839446 | 3/2000 | ............ | G01B/7/30 |
| EP | 0294636 A2 | 5/1988 | ........... | G01R/15/02 |
| EP | 0671605 | 9/1995 | ............ | G01D/5/16 |
| JP | 63-198876 | * 8/1988 | | |

* cited by examiner

Primary Examiner—Gerard R. Strecker
(74) Attorney, Agent, or Firm—Aaron Waxler

(57) ABSTRACT

An arrangement is provided for measuring the field strength of a magnetic field, or measuring field, by an angle sensor. The angle sensor is aligned with the field lines of the measuring field at the position of the field strength of the measuring field, or measuring position. A device for generating a magnetic auxiliary field at the measuring position is also included. The angle sensor can be impressed with the magnetic auxiliary field in a predeterminable field strength and in a direction deviating from that of the field lines of the measuring field at the measuring position, forming a resultant magnetic field with a field line direction. The field line direction is measured by the angle sensor as a measure of the field strength of the measuring field. The arrangement is reliable, suitable for measuring high magnetic field strengths, has no reactive effects, and permits measurements with magnetoresistive angle sensors.

12 Claims, 3 Drawing Sheets

ANGLE SENSOR FOR MEASURING MAGNETIC FIELD STRENGTH

Figure 1:
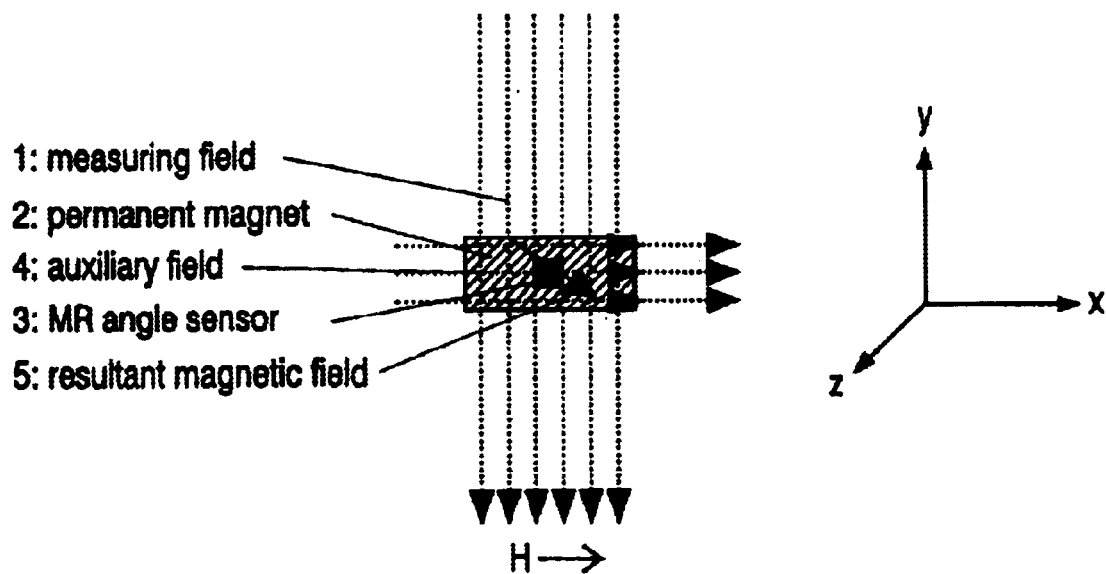

The invention relates to an arrangement for measuring the field strength of a magnetic field to be measured, hereinafter referred to as measuring field.

With the wider use of magnetic fields, particularly at high magnetic field strengths, it has become necessary to be able to determine these field strengths.

Angle sensors which can be influenced magnetically are known. The document EP 0 671 605 A2 describes an angle sensor with two contactless measuring sensor units arranged at an angular offset to each other, whose sensor voltages are functions of an angle to be measured with respect to a rotatable element, and the document DE 198 39 446 A1 discloses an arrangement for detecting the angle of rotation of a rotatable element, in which, while evaluating properties of a sensor arrangement, which properties can be magnetically influenced, a magnetic field generated or influenced by a rotatable element is detectable and can be used for determining the angle of rotation. These arrangements comprise magnetoresistive elements which have proved to be compact, robust and reliable circuit elements.

However, the angle sensors mentioned above measure the direction of a magnetic field rather than its magnetic field strength.

It is an object of the invention to provide an arrangement for measuring magnetic field strengths, which arrangement is particularly also suitable for measuring high magnetic field strength, has no reactive effect and is reliable and with which, preferably, measurements by means of magnetoresistive angle sensors are possible.

According to the invention, this object is solved by an arrangement of the type described in the opening paragraph which is arranged in a predetermined alignment with the field lines of the measuring field at the position of the field strength of the measuring field to be measured, which position is hereinafter referred to as measuring position, and a device for generating a magnetic auxiliary field at the measuring position, by means of which device the angle sensor which can be magnetically influenced can be impressed with the magnetic auxiliary field in a predeterminable field strength and in a direction deviating from that of the field lines of the measuring field at the measuring position, so that, at the measuring position, a resultant magnetic field is formed with a field line direction which is influenced by the measuring field and the magnetic auxiliary field, which field line direction is measured by the angle sensor, which can be magnetically influenced, as a measure of the field strength of the measuring field to be measured.

According to the invention, a linearly independent auxiliary field is thus superimposed on the measuring field at the measuring position. This superposition leads to a resultant field whose direction, i.e. whose angle relative to the alignment of the angle sensor, is a function of the field strength to be measured. This direction of the field lines of the resultant field can be measured very precisely with the angle sensor, so that the magnetic field strength to be measured can be easily and accurately determined via said function. The measurement can be further performed free from potential and without reactive effects.

A preferred embodiment of the arrangement according to the invention is characterized in that, at the measuring position, the field line direction of the magnetic auxiliary field is chosen to be at least substantially perpendicular to the field line direction of the measuring field. The effect of the rotation of the direction of the resultant field can be evaluated very well with an auxiliary field which is substantially orthogonal to the measuring field.

The measuring field may have a temporally, at least substantially constant field strength, or may also be a magnetic alternating field. Thus, a further field of use of the arrangement according to the invention is possible.

In the arrangement according to the invention, the device for generating the magnetic auxiliary field preferably comprises a permanent magnet This provides the possibility of a simpler and more compact structure. The permanent magnet may be advantageously rod-shaped or annular. In a modification, the magnetic auxiliary field may also be generated by coil configurations, preferably for the case where a magnetic auxiliary field with a temporally variable magnetic field strength should be made possible.

Since, as defined by the equation $$i = \oint \vec{H} \cdot \vec{ds}$$

the measuring field H can be generated by an electric current i flowing in an electric conductor with a current intensity to be measured, in which in the above equation $$\vec{ds}$$

indicates a vectorial path increment along the extension of the field lines of the measuring field, whose field strength is integrated, a particularly preferred embodiment of the invention provides the possibility of utilizing the described measurement of the magnetic field strength of a measuring field also for measuring an electric current by which the measuring field is generated. At the measuring position, the magnetic auxiliary field for forming a resultant magnetic field is again superimposed on the measuring field, and the direction of the field lines of the resultant magnetic field at the measuring position is measured as a measure of the current, to be measured, by the angle sensor which can be magnetically influenced.

In many electrotechnical fields, preferably also in the field of automobile electronics and electric techniques, the measurement of high currents, particularly those having a current value of more than 100 amperes, is becoming increasingly necessary. The severe requirements relating to the freedom of reactive effects on the supply system of the motor vehicle, insensitivity to interference fields, positioning tolerances and accuracy of current measurements can be particularly satisfied by the arrangement according to the invention. The arrangement is simple, compact and has a robust structure, and supplies accurate measuring results.

To obtain a particularly effective, insensitive and interference-free arrangement, a further embodiment of the invention is characterized by a magnetically conducting yoke at least substantially enclosing the electric conductor with the exception of an air gap and constituting a magnetic circuit, in which at least the angle sensor which can be influenced magnetically is arranged at least substantially within the air gap. Moreover, the device for generating the magnetic auxiliary field may at least be partly arranged in the air gap, preferably with a permanent magnet which is particularly formed as a rod-shaped or annular magnet, or optionally also with an arrangement of coils.

Magnetic stray fields can be easily and effectively shielded by the magnetically conducting yoke. In the area of the air gap, the magnetic field is very homogeneous so that manufacturing tolerances in the positioning of the individual components such as the angle sensor and, for example, the permanent magnet at the measuring position are negligible.

In a further advantageous embodiment of the invention, the air gap is constituted at least substantially by an inner area of a substantially annular permanent magnet, the substantially annular permanent magnet is inserted into the magnetic circuit constituted by the magnetically conducting yoke, and the angle sensor which can be magnetically influenced is arranged at least substantially within the inner area of the substantially annular permanent magnet. The advantage of such a configuration is its particular freedom from interference of magnetic stray fields, as well as its particular robustness obtained by the perfected magnetic and simultaneously mechanical shield.

In a further advantageous embodiment of the invention, the substantially annular permanent magnet is at least substantially enclosed by a substantially annular layer of a soft-magnetic material. This layer provides a shielding of the permanent magnet from magnetic stray fields and hence a further improvement of the freedom from interference. It is true that the magnetic circuit is more elaborate in this embodiment of the arrangement according to the invention but it provides the possibility of an even substantially better shielded and more homogeneous field than the previously described embodiments. To avoid eddy current effects, a ferromagnetic material with a minimal electrical conductivity may be used for the annular layer of a soft-magnetic material, i.e. the shielding soft-magnetic ring.

In accordance with a further embodiment of the invention, the yoke is arranged at least substantially in a plane perpendicular to the main direction of extension of the electric conductor in the section of the electric conductor which is at least substantially enclosed by the yoke and is thus optimally adapted to the variation of the magnetic field lines of the measuring field. The main direction of extension of the electric conductor at least substantially corresponds to its longitudinal axis and thus to the current direction in which the electric current flows through the electric conductor.

Advantageously, the yoke is formed at least substantially from a soft-magnetic material.

A particularly advantageous embodiment according to the invention is obtained in that the angle sensor which can be magnetically influenced is built up with magnetoresistive sensor elements. Such sensor elements are compact and robust and have a high measuring accuracy. By using angle sensors with magnetoresistive sensor elements, errors during the measurement of magnetic fields, due to the extremely small temperature coefficients of these sensor elements, can be reduced considerably so that a high measuring accuracy is achieved. At high current and field strengths, reproducible and substantially linear transfer characteristics can be achieved.

The use of magnetoresistive angle sensors in connection with a soft-magnetic circuit provides the possibility of realizing robust current measuring systems which satisfy the requirements described in the opening paragraph.

These and other aspects of the invention are apparent from and will be elucidated with reference to the embodiments described hereinafter.

Figure 2:
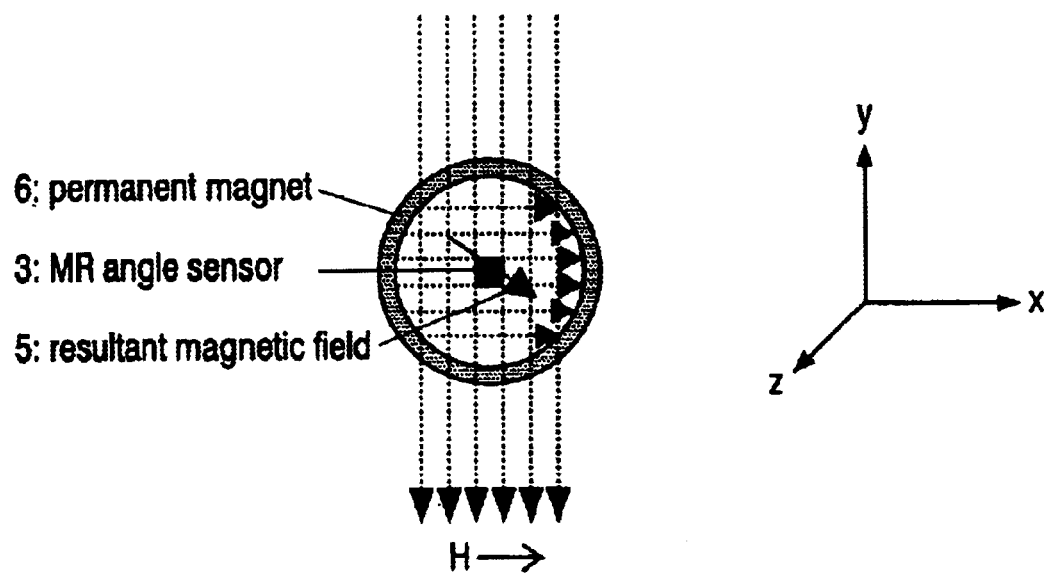
Figure 3:
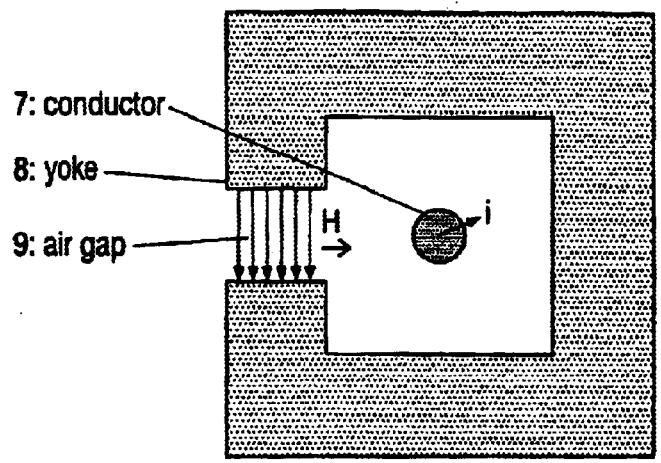
Figure 4:
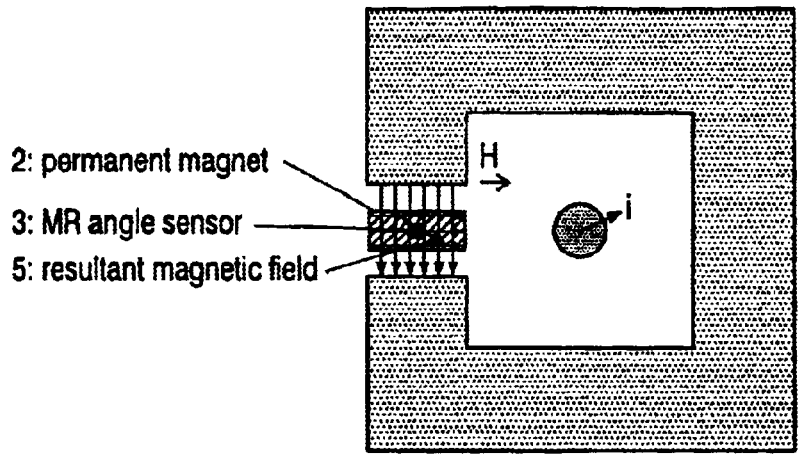
Figure 5:
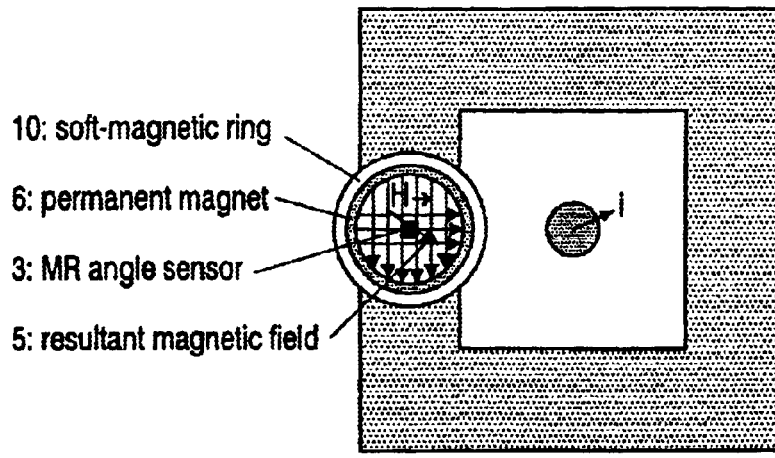
Figure 6:
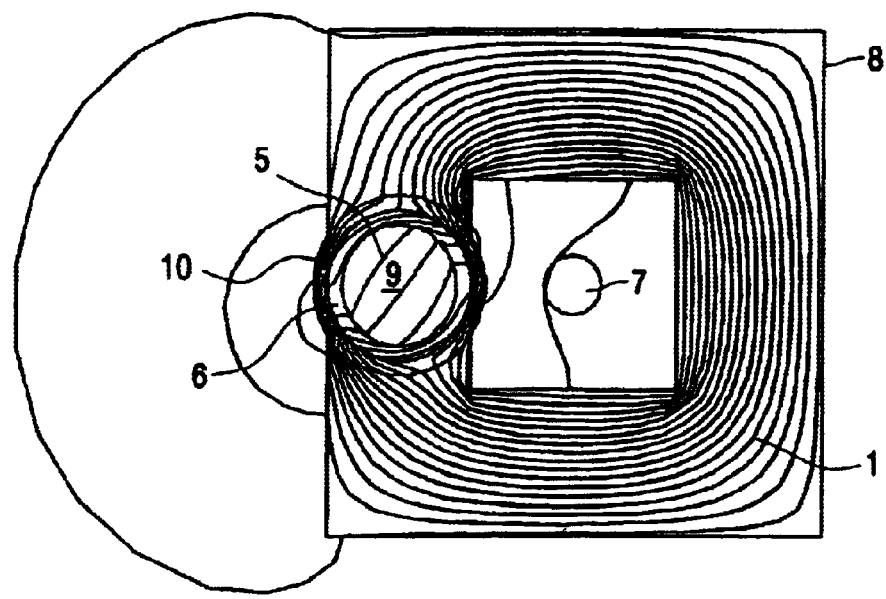
Figure 7:
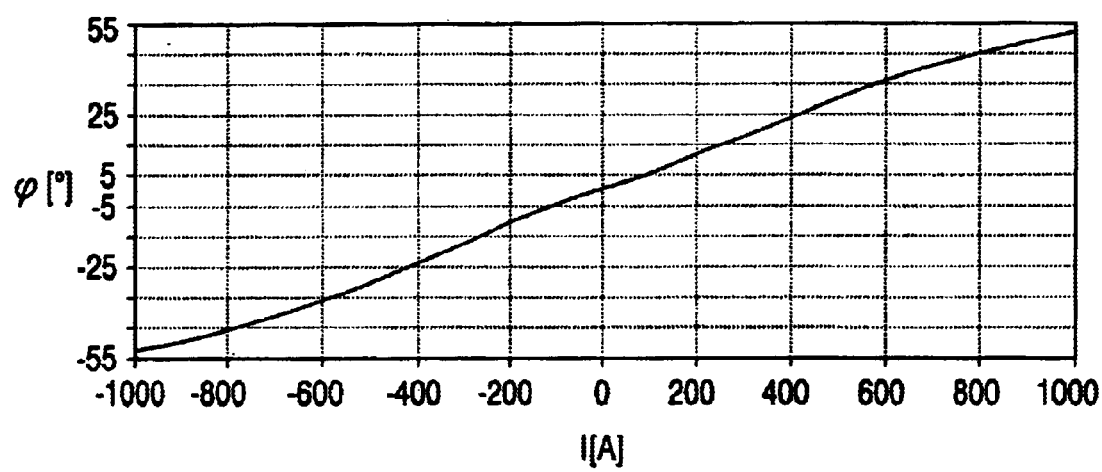

In the drawings:

FIG. 1 shows diagrammatically a first embodiment of an arrangement according to the invention, adapted to measure the magnetic field strength of a measuring field, FIG. 2 shows diagrammatically a second embodiment of an arrangement according to the invention, adapted to measure the magnetic field strength of a measuring field, FIG. 3 shows diagrammatically an arrangement with a magnetic yoke in which an electric current to be measured generates a measuring field, FIG. 4 shows diagrammatically a third embodiment of an arrangement according to the invention, adapted to measure the current intensity of an electric current, FIG. 5 shows diagrammatically a fourth embodiment of an arrangement according to the invention, adapted to measure the current intensity of an electric current, FIG. 6 shows the variation of the field lines of the resultant magnetic field when using the arrangement of the fourth embodiment shown in FIG. 5, and FIG. 7 shows an example of a function of the direction of the field lines of the resultant magnetic field, measured as an angle f of the excursion of this resultant magnetic field with respect to the direction of the field lines of the magnetic auxiliary field, in an arrangement as shown in FIGS. 5 and 6.

In FIG. 1, the reference numeral 1 denotes the field lines of a magnetic field (measuring field) H to be measured, which here extends in the opposite direction to the y axis of a Cartesian system of co-ordinates. In FIG. 1, this measuring field is at least substantially homogeneous, which also corresponds to a preferred embodiment.

The measuring field 1 incorporates an arrangement comprising a permanent magnet 2, here formed as a rod-shaped magnet, as well as an angle sensor 3 preferably formed as a magnetoresistive angle sensor, referred to as MR angle sensor. The permanent magnet 2 generates a magnetic auxiliary field whose field lines denoted by the reference numeral 4 extend orthogonally to the field lines of the measuring field 1 in the area of the measuring position at which the angle sensor 3 is positioned. By superimposing the measuring field 1 and the magnetic auxiliary field 4 at the measuring position, a resultant magnetic field is obtained, which is indicated in FIG. 1 by means of an arrow denoted by the reference numeral 5 and whose alignment (in the system of co-ordinates) changes with the field strength of the measuring field 1. The alignment of the resultant magnetic field, i.e. the direction of its field lines is measured by means of the angle sensor 3. This angle measuring value is thus a measure of the magnetic field strength to be measured. The accuracy of this measurement is determined by the error tolerances of the angle sensor 3, which can be held within very narrow limits. This results in a very simple and precise determination of the field strength of the measuring field.

FIG. 2 is a modification of the arrangement shown in FIG. 1, in which an annular permanent magnet 6 instead of a rod-shaped permanent magnet 2 is used. A more homogeneous form of the magnetic fields, particularly of the auxiliary field 4, can be achieved with this magnet.

FIG. 3 shows diagrammatically an arrangement in which an electric current i to be measured, which current flows through an electric conductor 7, generates a measuring field 1 of the magnetic field strength H. This arrangement is formed with a magnetic yoke 8 which, except for an air gap 9, encloses the conductor 7 and is made of a soft-magnetic material. The yoke 8 preferably extends substantially along a plane given by the co-ordinates x and y of a system of co-ordinates shown in FIG. 3, while the conductor 7 extends substantially along the z axis of this system of co-ordinates. The current i in FIG. 3 is assumed to be flowing out of the plane of the drawing. A measuring field 1 which is at least substantially homogeneous in a wide range is then formed in the air gap 9.

A third embodiment of the invention, shown in FIG. 4, is an arrangement for measuring the current i while using a configuration of a rod-shaped permanent magnet 2 and an angle sensor 3 as described with reference to the arrangement shown in FIG. 1. This configuration is inserted in the air gap 9 of the yoke 8 and measures the field strength of the measuring field 1 via the angle (f, see below) in that the field lines of the resultant magnetic field 5 adjust themselves with respect to the direction of the field lines of the magnetic auxiliary field 4. This arrangement provides a potential-free current measurement based on the above-mentioned relationship:

$$i = \oint \vec{H} \cdot ds$$

By shielding the conductor 7, through which the current i flows, and the soft-magnetic yoke 8, magnetic interference fields are shielded and a high, homogeneous magnetic field strength is obtained in the area of the air gap 9.

The embodiment shown in FIG. 4, in which a rod-shaped permanent magnet 2 present in the air gap 9 is used, is characterized by a smaller number of mechanical components for realizing the magnetic circuit. Advantageously, ferrimagnetic yoke materials with a small electric conductivity can be used for this purpose, which becomes manifest in small eddy current effects in the measurement of high-frequency currents.

FIG. 5 shows diagrammatically, as a fourth embodiment, a modification of the third embodiment of the invention, shown in FIG. 4. This arrangement, which is also adapted to measure the current intensity of an electric current, does not comprise a rod-shaped permanent magnet 2 but an annular permanent magnet 6, as already shown in FIG. 2. In addition, the annular permanent magnet 6 is surrounded by a soft-magnetic ring 10. It is true that the magnetic circuit thus formed, consisting of yoke 8, permanent magnet 6 and soft-magnetic ring 10 is slightly more elaborate, but it provides a substantially better shielded and more homogeneous field. To avoid a detrimental effect of eddy currents, a ferromagnetic material with a minimal electric conductivity is used for the shielding soft-magnetic ring 10.

FIG. 6 shows the variation of the field lines of the resultant magnetic field when using the arrangement of the fourth embodiment shown in FIG. 5. The contours of the electric conductor 7, the magnetic yoke 8, the annular permanent magnet 6 and the soft-magnetic ring 10 are shown. In the yoke 8, the field lines of the measuring field are concentrated to a very great extent and at least substantially homogeneously distributed on the air gap 9 formed in the inner part of the annular permanent magnet 6. The measuring field, which together with the magnetic auxiliary field is superimposed with the resultant field, is also at least substantially homogeneous in the air gap 9. The angle at which the field lines of the resultant magnetic field 5 adjust in the air gap 9 is a function of the current. It is measured by means of the angle sensor 3 which is preferably a magnetoresistive angle sensor.

FIG. 7 shows an example of the dependence of the direction of the field lines of the resultant magnetic field 5, measured as angle f of the excursion of this resultant magnetic field 5 with respect to the direction of the field lines of the magnetic auxiliary field 4, as a function of the current intensity of the current i to be measured in an arrangement as shown in FIGS. 5 and 6. An at least substantially linear relationship with the angle f is obtained over a large range for the current intensity of the current i to be measured. This provides good conditions for a high measuring accuracy of the arrangement.

The arrangement according to the invention, used for measuring the current intensity of a current, advantageously fulfills the increasingly stringent requirements, particularly in the field of automobile electronics and electric techniques for measuring high currents (preferably larger than 100 A). In these techniques, strict requirements are imposed, particularly as regards the freedom of reactive effects on the supply system, insensitivity to interference fields, positioning tolerances and the accuracy of the current measurement. In said embodiment of the arrangement according to the invention, used for measurements of high currents without reactive effects and free from potential, in which measurements the current intensity to be measured is transformed by means of a special magnetic circuit into a resultant magnetic field, which in a given spatial range is characterized by the value and the angle, and in which the angle of the field in this spatial range is a measure of the current intensity measured with an angle sensor, the use of preferably magnetoresistive angle sensors in connection with a soft-magnetic circuit provides the possibility of realizing robust current measuring systems that comply with the above-mentioned requirements.

The potential-free measurement of the current intensity by means of the magnetic field strength, using magnetoresistive angle sensors in the arrangement according to the invention, has the advantage that both direct currents and alternating currents can be measured. Stray fields can be shielded by using a yoke. The magnetic field is very homogeneous in the area of the air gap, so that positioning tolerances of the individual components are negligible. By using MR angle sensors, which operate very accurately, the errors in the measurements can be reduced also because of the prevailing, extremely small temperature coefficients. At high currents and field strengths, reproducible and substantially linear transfer characteristics can be obtained.

LIST OF REFERENCE SIGNS 1 field lines of the magnetic field to be measured (measuring field) H
2 rod-shaped permanent magnet
3 angle sensor
4 field lines of the magnetic auxiliary field
5 resultant magnetic field, indicated by an arrow in FIG. 1
6 annular permanent magnet
7 electric conductor
8 magnetic yoke
9 air gap
10 soft-magnetic ring
f angle of the excursion of the resultant magnetic field 5 with respect to the direction of the field lines of the magnetic auxiliary field 4
i electric current to be measured
H magnetic field strength of the measuring field 1

What is claimed is:

1. An arrangement for measuring field strength of a magnetic field to be measured, hereinafter referred to as measuring field, comprising:

an angle sensor which can be magnetically influenced and is arranged in a predetermined alignment with field lines of the measuring field at a position of the field strength of the measuring field, which position is hereinafter referred to as measuring position, and substantially annular magnet means positioned for generating a magnetic auxiliary field at the measuring position, the magnetic auxiliary field having a predeterminable field strength in a direction deviating from that of the field lines of the measuring field at the measuring position, the auxiliary field being impressed on the measuring field and the angle sensor, so that, at the measuring position, a resultant magnetic field is formed with a field line direction that defines an angle measuring value, and so that the angle measuring value is measured by the angle sensor as a measure of the field strength of the measuring field.

2. An arrangement as claimed in claim 1, characterized in that, at the measuring position, the field line direction of the magnetic auxiliary field is chosen to be at least substantially perpendicular to the field line direction of the measuring field.

3. An arrangement as claimed in claim 1, characterized in that the measuring field has a temporally, at least substantially constant field strength.

4. An arrangement as claimed in claim 1, characterized in that the measuring field is a magnetic alternating field.

5. An arrangement as claimed in claim 1, characterized in that the substantially annular magnet means for generating the magnetic auxiliary field comprises a permanent magnet.

6. An arrangement as claimed in claim 1, characterized in that the measuring field is generated by an electric current flowing in an electric conductor with a current intensity to be measured, and the direction of the field lines of the resultant magnetic field at the measuring position is measured as a measure of the current, to be measured, by the angle sensor which can be magnetically influenced.

7. An arrangement as claimed in claim 6, characterized by a magnetically conducting yoke at least substantially enclosing the electric conductor with the exception of an air gap and constituting a magnetic circuit, in which at least the angle sensor which can be influenced magnetically is arranged at least substantially within the air gap.

8. An arrangement as claimed in claim 7, characterized in that the air gap is constituted at least substantially by an inner area of a substantially annular permanent magnet, in that the substantially annular permanent magnet is inserted into the magnetic circuit constituted by the magnetically conducting yoke, and in that the angle sensor which can be magnetically influenced is arranged at least substantially within the inner area of the substantially annular permanent magnet.

9. An arrangement as claimed in claim 8, characterized in that the substantially annular permanent magnet is at least substantially enclosed by a substantially annular layer of a soft-magnetic material.

10. An arrangement as claimed in claim 7, characterized in that the yoke is arranged at least substantially in a plane perpendicular to the main direction of extension of the electric conductor in the section of the electric conductor which is at least substantially enclosed by the yoke.

11. An arrangement as claimed in claim 7, characterized in that the yoke is formed at least substantially from a soft-magnetic material.

12. An arrangement as claimed in claim 1, characterized in that the angle sensor which can be magnetically influenced is built up with magnetoresistive sensor elements.

* * * * *